United States Patent
Cheng et al.

(10) Patent No.: US 12,319,843 B2
(45) Date of Patent: Jun. 3, 2025

(54) POLISHING COMPOSITIONS AND METHODS OF USING THE SAME

(71) Applicant: Fujifilm Electronic Materials U.S.A., Inc., North Kingstown, RI (US)

(72) Inventors: Qingmin Cheng, Mesa, AZ (US); Bin Hu, Chandler, AZ (US); Yannan Liang, Gilbert, AZ (US); Hyosang Lee, Chandler, AZ (US); Liqing Wen, Mesa, AZ (US); Yibin Zhang, Gilbert, AZ (US); Abhudaya Mishra, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 18/670,879

(22) Filed: May 22, 2024

(65) Prior Publication Data
US 2024/0309241 A1    Sep. 19, 2024

Related U.S. Application Data

(63) Continuation of application No. 17/509,177, filed on Oct. 25, 2021, now Pat. No. 12,024,650.

(60) Provisional application No. 63/107,188, filed on Oct. 29, 2020.

(51) Int. Cl.
C09G 1/02       (2006.01)
C09K 13/00      (2006.01)
H01L 21/321     (2006.01)

(52) U.S. Cl.
CPC ......... *C09G 1/02* (2013.01); *C09K 13/00* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,063,306 A | 5/2000 | Kaufman et al. | |
| 2002/0096659 A1 | 7/2002 | Sakai et al. | |
| 2009/0215266 A1 | 8/2009 | Thomas et al. | |
| 2013/0327977 A1* | 12/2013 | Singh | H01L 21/30625 |
| | | | 438/692 |
| 2015/0221520 A1 | 8/2015 | Singh et al. | |
| 2019/0055430 A1 | 2/2019 | Shi et al. | |
| 2019/0185714 A1 | 6/2019 | Penta et al. | |
| 2020/0224058 A1 | 7/2020 | Leonov et al. | |
| 2020/0263056 A1 | 8/2020 | Akaji et al. | |
| 2022/0033682 A1* | 2/2022 | Wu | C09G 1/02 |

FOREIGN PATENT DOCUMENTS

| | | |
|---|---|---|
| EP | 1936673 | 6/2008 |
| JP | 2001303050 A | 10/2001 |
| KR | 20100083492 A | 7/2010 |
| KR | 20130053226 A | 5/2013 |
| KR | 20190071268 | 6/2019 |
| KR | 1020200032601 | 3/2020 |

OTHER PUBLICATIONS

Extended European Search Report in European Appln No. 21887258.8, dated Mar. 15, 2024, 7 pages.
Office Action in Chinese Appln. No. 202180077694.7, mailed on Mar. 10, 2025, 26 pages (with English translation).

\* cited by examiner

*Primary Examiner* — Roberts P Culbert
(74) *Attorney, Agent, or Firm* — Fish & Richardson P.C.

(57) ABSTRACT

This disclosure relates to polishing compositions that include (1) at least one abrasive; (2) at least one organic acid or a salt thereof; (3) at least one first amine compound, the at least one first amine compound including an alkylamine having a 6-24 carbon alkyl chain; (4) at least one second amine compound containing at least two nitrogen atoms, the second amine compound being different from the first amine compound; and (5) an aqueous solvent.

20 Claims, No Drawings

POLISHING COMPOSITIONS AND METHODS OF USING THE SAME

CROSS-REFERENCE TO RELATED APPLICATION

This application is a continuation of and claims benefit under 35 U.S.C. § 120 to U.S. application Ser. No. 17/509,177, filed on Oct. 25, 2021, which claims priority to U.S. Provisional Application Ser. No. 63/107,188, filed on Oct. 29, 2020. The contents of each of these earlier applications are hereby incorporated by reference in their entirety.

BACKGROUND

The semiconductor industry is continually driven to improve chip performance by further miniaturization of devices through process and integration innovations. Chemical Mechanical Polishing/Planarization (CMP) is a powerful technology as it makes many complex integration schemes at the transistor level possible, thereby facilitating increased chip density.

CMP is a process used to planarize/flatten a wafer surface by removing material using abrasion-based physical processes concurrently with surface-based chemical reactions. In general, a CMP process involves applying a CMP slurry (e.g., an aqueous chemical formulation) to a wafer surface while contacting the wafer surface with a polishing pad and moving the polishing pad in relation to the wafer. Slurries typically include an abrasive component and dissolved chemical components, which can vary significantly depending upon the materials (e.g., metals, metal oxides, metal nitrides, dielectric materials such as silicon oxide and silicon nitride, etc.) present on the wafer that will be interacting with the slurry and the polishing pad during the CMP process.

Molybdenum is a transition metal with very low chemical reactivity, high hardness, great conductivity, strong wear resistance, and high corrosion-resistance. Molybdenum can also form heteropoly and alloy compounds with other elements. With respect to its use in the microelectronic industry, molybdenum and alloys thereof may find use as interconnects, diffusion barriers, photo masks, and plug filling materials. However, because of its hardness and chemical resistance, molybdenum is difficult to be polished with high removal rate and low defectivity, which presents a challenge for CMP of molybdenum containing substrates.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

This disclosure is based on the unexpected discovery that certain polishing compositions can selectively remove molybdenum (Mo) and/or its alloys relative to other materials (e.g., dielectric materials) in a semiconductor substrate during a CMP process in a controlled manner with an excellent corrosion resistance and a low static etch rate for Mo.

In one aspect, this disclosure features polishing compositions that include (1) at least one abrasive; (2) at least one organic acid or a salt thereof; (3) at least one first amine compound, the at least one first amine compound including an alkylamine having a 6-24 carbon alkyl chain; (4) at least one second amine compound containing at least two nitrogen atoms, the second amine compound being different from the first amine compound; and (5) an aqueous solvent.

In another aspect, this disclosure features polishing compositions that include (1) at least one abrasive; (2) at least one organic acid or a salt thereof; (3) at least one first amine compound, the at least one first amine compound including an alkylamine having a 6-24 carbon alkyl chain; and (4) an aqueous solvent.

In yet another aspect, this disclosure features methods that includes (a) applying a polishing composition described herein to a substrate containing molybdenum or an alloy thereof on a surface of the substrate; and (b) bringing a pad into contact with the surface of the substrate and moving the pad in relation to the substrate.

DETAILED DESCRIPTION

The present disclosure relates to polishing compositions and methods for polishing semiconductor substrates using the same. In some embodiments, this disclosure relates to polishing compositions used for polishing substrates that include at least one portion containing molybdenum (Mo) metal and its alloys.

In one or more embodiments, a polishing composition described herein can include at least one abrasive, at least one organic acid or a salt thereof, at least one first amine compound that includes an alkylamine having at least one 6-24 carbon alkyl chain, at least one second amine compound different from the first amine and containing at least two nitrogen atoms, and an aqueous solvent. In one or more embodiments, a polishing composition according to the present disclosure can include from about 0.01% to about 50% by weight of at least one abrasive, from about 0.001% to about 10% by weight of at least one organic acid, from about 0.001% to about 5% by weight of at least one first amine compound, from about 0.001% to about 5% at least one second amine compound, and the remaining percent by weight (e.g., from about 30% to about 99.99% by weight) of an aqueous solvent (e.g., deionized water).

In one or more embodiments, the present disclosure provides a concentrated polishing composition that can be diluted with water prior to use by up to a factor of two, or up to a factor of four, or up to a factor of six, or up to a factor of eight, or up to a factor of ten, or up to a factor of 15, or up to a factor of 20. In other embodiments, the present disclosure provides a point-of-use (POU) polishing composition, comprising the above-described polishing composition, water, and optionally an oxidizer.

In one or more embodiments, a POU polishing composition can include from about 0.01% to about 25% by weight of at least one abrasive, from about 0.001% to about 1% by weight of at least one organic acid, from about 0.001% to about 0.5% by weight of at least one first amine compound, from about 0.001% to about 0.5% by weight of at least one second amine compound, and the remaining percent by weight (e.g., from about 65% to about 99.99% by weight) of an aqueous solvent (e.g., deionized water).

In one or more embodiments, a concentrated polishing composition can include from 0.02% to about 50% by weight of at least one abrasive, from about 0.01% to about 10% by weight of at least one organic acid, from about 0.01% to about 5% by weight of at least one first amine compound, from about 0.01% to about 5% by weight of at least one second amine compound, and the remaining percent by weight (e.g., from about 35% to about 99.98% by weight) of an aqueous solvent (e.g., deionized water).

In one or more embodiments, the polishing compositions described herein can include at least one (e.g., two or three) abrasive. In one or more embodiments, the at least one abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In some embodiments, the at least one abrasive has a high purity, and can have less than about 100 ppm of alcohol, less than about 100 ppm of ammonia, and less than about 100 ppb of an alkali cation such as sodium cation. The abrasive can be present in an amount of from about 0.01% to about 12% (e.g., from about 0.5% to about 10%), based on the total weight of a POU polishing composition, or any subranges thereof.

In one or more embodiments, the abrasive is a silica-based abrasive, such as one selected from the group consisting of colloidal silica, fumed silica, and mixtures thereof. In one or more embodiments, the abrasive can be surface modified with organic groups and/or non-siliceous inorganic groups. For example, the cationic abrasive can include terminal groups of formula (I):

$$—O_m—X—(CH_2)_n—Y \qquad (I),$$

in which m is an integer from 1 to 3; n is an integer from 1 to 10; X is Al, Si, Ti, Ce, or Zr; and Y is a cationic amino or thiol group. As another example, the anionic abrasive can include terminal groups of formula (I):

$$—O_m—X—(CH_2)_n—Y \qquad (I),$$

in which m is an integer from 1 to 3; n is an integer from 1 to 10; X is Al, Si, Ti, Ce, or Zr; and Y is an acid group (e.g., a sulfonic acid group).

In one or more embodiments, the abrasive described herein can have a mean particle size of from at least about 1 nm (e.g., at least about 5 nm, at least about 10 nm, at least about 20 nm, at least about 40 nm, at least about 50 nm, at least about 60 nm, at least about 80 nm, or at least about 100 nm) to at most about 1000 nm (e.g., at most about 800 nm, at most about 600 nm, at most about 500 nm, at most about 400 nm, at most about 200 nm, at most about 150 nm, or at most about 100 nm). As used herein, the mean particle size (MPS) is determined by dynamic light scattering techniques.

In one or more embodiments, the at least one abrasive is in an amount of from at least about 0.01% (e.g., at least about 0.05%, at least about 0.1%, at least about 0.2%, at least about 0.4%, at least about 0.5%, at least about 0.6%, at least about 0.8%, at least about 1%, at least about 1.2%, at least about 1.5%, at least about 1.8%, or at least about 2%) by weight to at most about 50% (e.g., at most about 45%, at most about 40%, at most about 35%, at most about 30%, at most about 25%, at most about 20%, at most about 15%, at most about 12%, at most about 10%, at most about 5%, at most about 4%, at most about 3%, at most about 2%, at most about 1%) by weight of the polishing compositions described herein.

In one or more embodiments, the polishing compositions described herein include at least one (e.g., two or three) organic acid or a salt of the organic acid. In one or more embodiments, the organic acid (or salts thereof) can be selected from the group consisting of a carboxylic acid, an amino acid, an organic sulfonic acid, an organic phosphonic acid, or mixtures thereof. In some embodiments, the organic acid can be a carboxylic acid that includes one or more (e.g., two, three, or four) carboxylic acid groups, such as a dicarboxylic acid or a tricarboxylic acid. In some embodiments, the organic acid or salts thereof can be an amino acid including a carboxylic acid group. In one or more embodiments, the organic acid is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethanesulfonic acid, ethyl phosphoric acid, cyanocthyl phosphoric acid, phenyl phosphoric acid, vinyl phosphoric acid, poly (vinylphosphonic acid), 1-hydroxyethane-1,1-diphosphonic acid, nitrilotri(methylphosphonic acid), diethylenetriaminepentakis(methylphosphonic acid), N,N,N'N'-ethylenediaminetetrakis(methylene phosphonic acid), n-hexylphosphonic acid, benzylphosphonic acid, phenylphosphonic acid, salts thereof, and mixtures thereof. Without wishing to be bound by theory, it is believed that the organic acid (such as those described above) can be used as an effective metal removal rate enhancer in the polishing compositions described herein to improve the removal rate of molybdenum and/or its alloys in a semiconductor substrate.

In one or more embodiments, the at least one organic acid or a salt thereof is in an amount of from at least about 0.001% (e.g., at least about 0.003%, at least about 0.005%, at least about 0.01%, at least about 0.03%, at least about 0.05%, at least about 0.1%, at least about 0.3%, at least about 0.5%, at least about 1%, at least about 1.3%, or at least about 1.5%) by weight to at most about 10% (e.g., at least about 9%, at least about 8%, at least about 7%, at least about 6%, at least about 5%, at least about 4%, at least about 3%, at least about 2.5%, at most about 2.2%, at most about 2%, at most about 1.7%, at most about 1.5%, at most about 1.2%, at most about 1%, at most about 0.7%, at most about 0.5%, at most about 0.2%, at most about 0.15%, at most about 0.1%, at most about 0.07%, or at most about 0.05%) by weight of the polishing compositions described herein. In embodiments where more than one organic acid is included in the polishing composition, the above ranges may apply to each organic acid independently, or to the combined amount of organic acids within the composition.

In one or more embodiments, the polishing compositions described herein include at least one (e.g., two or three) first amine compound. In one or more embodiments, the first amine compound can include only one amine group. In one or more embodiments, the first amine compound can be an alkylamine compound that has at least one (e.g., two or three) alkyl chain that includes between 6 and 24 (i.e., 6, 7, 8, 9, 10, 11, 12, 13, 14, 15, 16, 17, 18, 19, 20, 21, 22, 23, or 24) carbons. In one or more embodiments, the alkyl chain can be a linear, branched, or cyclic alkyl group. In one or more embodiments, the alkylamine compound can be a primary amine, secondary amine, tertiary amine, or cyclic amine compound. In one or more embodiments, the alkylamine compound can be an alkoxylated amine (e.g., include ethoxylate and/or propoxylate groups). In one or more embodiments, the alkoxylated amine can include from 2 to 100 ethoxylate and/or propoxylate groups. In some embodiments, the at least one alkylamine compound has an alkyl chain that includes between 6 and 18 carbons. In some embodiments, the alkylamine is selected from the group consisting of hexylamine, octylamine, decylamine, dodecylamine, tetradecylamine, pentadecylamine, hexadecylamine, octadecylamine, cyclohexylamine, dicyclohexylamine, or mixtures thereof. Without wishing to be bound by theory, it is surprising that the alkylamine compounds described above can significantly reduce or minimize the corrosion or etching of molybdenum and/or its alloys in a semiconductor substrate.

In one or more embodiments, the at least one first amine compound is in an amount of from at least about 0.001% (e.g., at least about 0.003%, at least about 0.005%, at least about 0.01%, at least about 0.03%, at least about 0.05%, at least about 0.1%, at least about 0.3%, at least about 0.5%) by weight to at most about 5% (e.g., at most about 4.5%, at most about 4%, at most about 3.5%, at most about 3%, at most about 2.5%, at most about 2%, at most about 1.5%, at most about 1%, at most about 0.8%, at most about 0.6%, at most about 0.5%, at most about 0.4%, at most about 0.2%, at most about 0.1%, at most about 0.08%, at most about 0.05%, at most about 0.02%, at most about 0.01%, at most about 0.0075%, or at most about 0.005%) by weight of the polishing compositions described herein.

In one or more embodiments, the polishing compositions described herein optionally include at least one (e.g., two or three) second amine compound different from the first amine compound. In one or more embodiments, the second amine compound contains at least two (e.g., three or four) nitrogen atoms. In one or more embodiments, the second amine compound has a molecular weight from at least about 50 g/mol (e.g., at least about 100 g/mol, at least about 150 g/mol, at least about 200 g/mol, at least about 250 g/mol, at least about 300 g/mol, at least about 350 g/mol, at least about 400 g/mol, at least about 450 g/mol, or at least about 500 g/mol) to at most about 1000 g/mol (e.g., at most about 950 g/mol, at most about 900 g/mol, at most about 850 g/mol, at most about 800 g/mol, at most about 750 g/mol, at most about 700 g/mol, at most about 650 g/mol, at most about 600 g/mol, at most about 550 g/mol, or at most about 500 g/mol).

In one or more embodiments, the second amine compound is a linear diamine, wherein a linear diamine is a molecule that includes two primary amines separated by a linear alkyl chain. In one or more embodiments, the second amine compound is a non-linear diamine (e.g., a branched or cyclic diamine or a diamine containing a secondary or tertiary amino group). In one or more embodiments, the second amine compound is selected from the group consisting of 1,3-pentanediamine, aminopropyl di-iso-propanolamine, aminopropyldiethanolamine, ethylenediamine, 1,3-diaminopropane, butane-1,4-diamine, pentane-1,5-diamine, aminoethylethanolamine, trimethylethylenediamine, 1,2-diaminopropane, 1,12-diaminododecane, 1,2-diaminocyclohexane, and mixtures thereof.

In one or more embodiments, the second amine compound is in an amount of from at least about 0.001% (e.g., at least about 0.003%, at least about 0.005%, at least about 0.01%, at least about 0.03%, at least about 0.05%, at least about 0.1%, at least about 0.3%, at least about 0.5%) by weight to at most about 5% (e.g., at most about 4%, at most about 3%, at most about 2%, at most about 1%, at most about 0.8%, at most about 0.6%, at most about 0.5%, at most about 0.4%, at most about 0.2%, at most about 0.1%, at most about 0.08%, at most about 0.05%, at most about 0.02%, at most about 0.0075%, or at most about 0.005%) by weight of the polishing compositions described herein. In one or more embodiments, the second amine compound can be omitted from the polishing compositions described herein. Without wishing to be bound by theory, it is believed that the second compound described above can significantly increase the removal rate of molybdenum and/or its alloys in a semiconductor substrate and can produce synergistic effect (e.g., a relatively high Mo removal rate with a relatively low corrosion of Mo, as evidenced by a lower Mo static etch rate when the two amines are combined) when used in combination with the first amine described above.

In one or more embodiments, the polishing compositions described herein can include at least one (e.g., two or three) pH adjustor, if necessary, to adjust the pH to a desired value. In some embodiments, the at least one pH adjustor can be an acid (e.g., an organic or inorganic acid) or a base (e.g., an organic or inorganic base). For example, the pH adjustor can be selected from the group consisting of nitric acid, hydrochloric acid, sulfuric acid, propionic acid, citric acid, malonic acid, hydrobromic acid, hydroiodic acid, perchloric acid, ammonia, ammonium hydroxide, sodium hydroxide, potassium hydroxide, cesium hydroxide, monoethanolamine, diethanolamine, triethanolamine, methylethanolamine, methyldiethanolamine tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl) methylammonium hydroxide, choline hydroxide, and any combinations thereof.

In one or more embodiments, the at least one pH adjuster is in an amount of from at least about 0.001% (e.g., at least about 0.005%, at least about 0.01%, at least about 0.05%, at least about 0.1%, at least about 0.2%, at least about 0.4%, at least about 0.5%, at least about 1% or at least about 1.5%) by weight to at most about 2.5% (e.g., at most about 2%, at most about 1.5%, at most about 1%, at most about 0.5%, at most about 0.1%, or at most about 0.5%) by weight of the polishing compositions described herein.

In one or more embodiments, the polishing compositions described herein can be either acidic or basic. In some embodiments, the polishing compositions can have a pH ranging from at least about 2 to at most about 11. When the polish compositions are acidic, the pH can range from at least about 2 (e.g., at least about 2.5, at least about 3, at least about 3.5, at least about 4, at least about 4.5, or at least about 5) to at most about 11 (e.g., at most about 10.5, at most about 10, at most about 9.5, at most about 9, at most about 8.5, at most about 8, at most about 7.5, at most about 7, at most about 6.5, at most about 6, at most about 5.5, at most about 5, at most about 4.5, or at most about 4). When the polishing compositions are acidic, the pH can range from at least about 3 (e.g., at least about 3.5, at least about 4, at least about 4.5, at least about 5, at least about 5.5, at least about 6, at least about 6.5) to at most about 7 (e.g., at most about 6.5, at most about 6, at most about 5.5, at most about 5, at most about 4.5, or at most about 4, at most about 3.5).

In one or more embodiments, the polishing compositions described herein can include a solvent (e.g., a primary solvent), such as an aqueous solvent (e.g., water or a solvent including water and an organic solvent). In some embodiments, the solvent (e.g., water) is in an amount of from at least about 20% (e.g., at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 92%, at least about 94%, at least about 95%, or at least about 97%) by weight to at most about 99% (e.g., at most about 98%, at most about 96%, at most about 94%, at most about 92%, at most about 90%, at most about 85%, at most about 80%, at most about 75%, at most about 70%, or at most about 65%) by weight of the polishing compositions described herein.

In one or more embodiments, an optional secondary solvent (e.g., an organic solvent) can be used in the polish compositions (e.g., a POU or concentrated polishing composition) of the present disclosure, which can help with the dissolution of an ingredient (e.g., an azole-containing corrosion inhibitor). In one or more embodiments, the secondary solvent can be one or more alcohols, alkylene glycols, or alkylene glycol ethers. In one or more embodiments, the secondary solvent comprises one or more solvents selected from the group consisting of ethanol, 1-propanol, 2-propanol, n-butanol, propylene glycol, 2-methoxyethanol, 2-ethoxyethanol, propylene glycol propyl ether, and ethylene glycol.

In some embodiments, the secondary solvent is in an amount of from at least about 0.005% (e.g., at least about 0.01%, at least about 0.02%, at least about 0.05%, at least about 0.1%, at least about 0.2%, at least about 0.4%, at least about 0.5%, at least about 0.6%, at least about 0.8%, at least about 1%, at least about 3%, at least about 5%, or at least about 10%) by weight to at most about 15% (e.g., at most about 12%, at most about 10%, at most about 5%, at most about 3%, at most about 2%, at most about 1%, at most about 0.8%, at most about 0.6%, at most about 0.5%, or at most about 0.1%) by weight of the polishing compositions described herein.

In one or more embodiments, the polishing compositions described herein can further include at least one optional additive selected from the group consisting of an azole compound, an oxidizer, a chelating agent, a surfactant, a corrosion inhibitor, and a water-soluble polymer.

The azole compound is not particularly limited, but specific examples thereof include heterocyclic azoles, substituted or unsubstituted triazoles (e.g., benzotriazoles), substituted or unsubstituted tetrazoles, substituted or unsubstituted diazoles (e.g., imidazoles, benzimidazoles, thiadiazoles, and pyrazoles), and substituted or unsubstituted benzothiazoles. Herein, a substituted diazole, triazole, or tetrazole refers to a product obtained by substitution of one or two or more hydrogen atoms in the diazole, triazole, or tetrazole with, for example, a carboxyl group, an alkyl group (e.g., a methyl, ethyl, propyl, butyl, pentyl, or hexyl group), a halogen group (e.g., F, Cl, Br, or I), an amino group, or a hydroxyl group. In one or more embodiments, the azole compound can be selected from the group consisting of tetrazole, benzotriazole, tolyltriazole, methyl benzotriazole (e.g., 1-methyl benzotriazole, 4-methyl benzotriazole, and 5-methyl benzotriazole), ethyl benzotriazole (e.g., 1-ethyl benzotriazole), propyl benzotriazole (e.g., 1-propyl benzotriazole), butyl benzotriazole (e.g., 1-butyl benzotriazole and 5-butyl benzotriazole), pentyl benzotriazole (e.g., 1-pentyl benzotriazole), hexyl benzotriazole (e.g., 1-hexyl benzotriazole and 5-hexyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chloromethyl benzotriazole (e.g., 1-(chloromethyl)-1-H-benzotriazole), chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-amino-4H-1,2,4-triazole, aminotetrazole, tetrazole, phenyltetrazole, phenyl-tetrazole-5-thiol, and combinations thereof. Without wishing to be bound by theory, it is believed that the azole compounds can be used as a corrosion inhibitor in the polishing compositions described herein to reduce the removal of certain materials (e.g., metals or dielectric materials) during the polishing process.

In some embodiments, the azole compound can be from at least about 0.001% (e.g., at least about 0.002%, at least about 0.004%, at least about 0.005%, at least about 0.006%, at least about 0.008%, at least about 0.01%, at least about 0.02%, at least about 0.04%, at least about 0.05%, at least about 0.06%, at least about 0.08%, or at least about 0.1%) by weight to at most about 1% (e.g., at most about 0.9%, at most about 0.8%, at most about 0.7%, at most about 0.6%, at most about 0.5%, at most about 0.4%, at most about 0.3%, at most about 0.2%, at most about 0.18%, at most about 0.16%, at most about 0.15%, at most about 0.14%, at most about 0.12%, at most about 0.1%, at most about 0.08%, at most about 0.06%, at most about 0.05%, at most about 0.04%, at most about 0.03%, at most about 0.02%, or at most about 0.01%) by weight of the polishing compositions described herein.

The oxidizing agent is not particularly limited, but specific examples thereof include ammonium persulfate, potassium persulfate, hydrogen peroxide, ferric nitrate, diammonium cerium nitrate, iron sulfate, hypochlorous acid, ozone, potassium periodate, and peracetic acid. Without wishing to be bound by theory, it is believed that the oxidizing agent can facilitate the removal of materials during the polishing process.

In some embodiments, the oxidizing agent can be from at least about 0.05% (e.g., at least about 0.1%, at least about 0.2%, at least about 0.3%, at least about 0.4%, at least about 0.5%, at least about 0.6%, at least about 0.7%, at least about 0.8%, at least about 0.9%, at least about 1%, at least about 1.5%, or at least about 2%) by weight to at most about 10% (e.g., at most about 9%, at most about 8%, at most about 7%, at most about 6%, at most about 5%, at most about 4%, at most about 3%, at most about 2%, or at most about 1%) by weight of the polishing compositions described herein.

In one or more embodiments, the chelating agent can be selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, ammonia, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethane-sulfonic acid, ethylenediaminetetraacetic acid, diethylenetriaminepentaacetic acid, nitrilotriacetic acid, acetylacetone, aminotri(methylenephosphonic acid), 1-hydroxyethylidene (1,1-diphosphonic acid), 2-phosphono-1,2,4-butanetricarboxylic acid, hexamethylenediaminetetra(methylenephosphonic acid), ethylenediamine-tetra(methylenephosphonic acid), diethylenetriaminepenta(methylenephosphonic acid), salts thereof, and mixtures thereof. Without wishing to be bound by theory, it is believed that the chelating agent can serve as a removal rate enhancer to facilitate removal of certain materials on a substrate.

In some embodiments, the chelating agent can be from at least about 0.001% (e.g., at least about 0.002%, at least about 0.003%, at least about 0.004%, at least about 0.005%, at least about 0.006%, at least about 0.007%, at least about 0.008%, at least about 0.009%, or at least about 0.01%) by weight to at most about 10% (e.g., at most about 8%, at most about 6%, at most about 5%, at most about 4%, at most about 2%, at most about 1%, at most about 0.8%, at most about 0.6%, or at most about 0.5%) by weight of the polishing compositions described herein.

In one or more embodiments, the polishing compositions described herein can also include one or more surfactants selected from the group consisting of anionic surfactants, non-ionic surfactants, amphoteric surfactants, cationic surfactants, and mixtures thereof.

The cationic surfactant is not particularly limited, but specific examples thereof include aliphatic amine salts and aliphatic ammonium salts.

The non-ionic surfactant is not particularly limited, but specific examples thereof include an ether-type surfactant, an ether ester-type surfactant, an ester-type surfactant, and an acetylene-based surfactant. The ether-type surfactant is not particularly limited, but specific examples thereof include polyethylene glycol mono-4-nonylphenyl ether, polyethylene glycol monooleyl ether, and triethylene glycol monododecyl ether. The ether ester-type surfactant is not particularly limited, but a specific example thereof is a polyoxyethylene ether of a glycerin ester. The ester-type surfactant is not particularly limited, but specific examples thereof include a polyethylene glycol fatty acid ester, a glycerin ester, and a sorbitan ester. The acetylene-based surfactant is not particularly limited, but specific examples thereof include ethylene oxide adducts of acetylene alcohol, acetylene glycol, and acetylene diol.

The amphoteric surfactant is not particularly limited, but specific examples thereof include betaine-based surfactants.

The anionic surfactant is not particularly limited, but specific examples thereof include carboxylic acid salts, sulfonic acid salts, sulfate salts, and phosphate salts. The carboxylic acid salts are not particularly limited, but specific examples thereof include fatty acid salts (e.g., soaps) and alkyl ether carboxylic acid salts. Examples of the sulfonic acid salts include alkylbenzenesulfonic acid salts, alkylnaphthalenesulfonic acid salts, and α-olefin sulfonic acid salts. The sulfate salts are not particularly limited, but specific examples thereof include higher alcohol sulfate salts and alkyl sulfate salts. The phosphates are not particularly limited, but specific examples thereof include alkyl phosphates and alkyl ester phosphates.

The corrosion inhibitor is not particularly limited, but specific examples thereof include choline hydroxide, amino alcohols (e.g., monoethanolamine and 3-amino-4-octanol), ethylenediaminetetra(methylenephosphonic acid), and mixtures thereof.

The water-soluble polymer is not particularly limited, but specific examples thereof include polyacrylamide, polyvinyl alcohol, polyvinylpyrrolidone, polyacrylic acid, hydroxyethyl cellulose, and copolymers that include the polymers previously listed. Without wishing to be bound by theory, it is believed that the water-soluble polymer can serve as a removal rate inhibitor to reduce the removal rate of certain exposed materials on a substrate that do not intend to be removed or should be removed at a lower removal rate during the polishing process.

In one or more embodiments, the water-soluble polymer can be from at least about 0.01% (e.g., at least about 0.02%, at least about 0.03%, at least about 0.04%, at least about 0.05%, at least about 0.06%, at least about 0.07%, at least about 0.08%, at least about 0.09%, or at least about 0.1%) by weight to at most about 1% (e.g., at most about 0.8%, at most about 0.6%, at most about 0.5%, at most about 0.4%, at most about 0.2%, at most about 0.1%, at most about 0.08%, at most about 0.06%, or at most about 0.05%) by weight of the polishing compositions described herein.

In one or more embodiments, the polishing compositions described herein can be substantially free of one or more of certain ingredients, such as organic solvents, pH adjusting agents (e.g., acids or bases), amines, alkali bases (such as alkali hydroxides), fluorine containing compounds (e.g., fluoride compounds or fluorinated compounds (such as fluorinated polymers/surfactants)), silicon containing compounds such as silanes (e.g., alkoxysilanes), nitrogen containing compounds (e.g., amino acids, amines, or imines (e.g., amidines such as 1,8-diazabicyclo[5.4.0]-7-undecene (DBU) and 1,5-diazabicyclo[4.3.0]non-5-ene (DBN))), salts (e.g., halide salts or metal salts), polymers (e.g., non-ionic, cationic, or anionic polymers), inorganic acids (e.g., hydrochloric acid, sulfuric acid, phosphoric acid, or nitric acid), surfactants (e.g., cationic surfactants, anionic surfactants, or non-ionic surfactants), plasticizers, oxidizing agents (e.g., $H_2O_2$), quaternary ammonium compounds (e.g., salts such as tetraalkylammonium salts and hydroxides such as tetramethylammonium hydroxide), corrosion inhibitors (e.g., azole or non-azole corrosion inhibitors), electrolytes (e.g., polyelectrolytes), and/or certain abrasives (e.g., ceria abrasives, non-ionic abrasives, surface modified abrasives, or negatively/positively charged abrasives). The halide salts that can be excluded from the polishing compositions include alkali metal halides (e.g., sodium halides or potassium halides) or ammonium halides (e.g., ammonium chloride), and can be chlorides, bromides, or iodides. As used herein, an ingredient that is "substantially free" from a polishing composition refers to an ingredient that is not intentionally added into the polishing composition. In some embodiments, the polishing compositions described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing compositions. In some embodiments, the polishing compositions described can be completely free of one or more of the above ingredients.

In one or more embodiments, the polishing compositions described herein can have a ratio (i.e., a removal rate ratio or selectivity) of a removal rate for molybdenum and/or its alloys to a removal rate for a dielectric material (e.g., TEOS) of from at least about 3:1 (e.g., at least about 4:1, at least about 5:1, at least about 10:1, at least about 25:1, at least about 50:1, at least about 60:1, at least about 75:1, at least about 100:1, at least about 150:1, at least about 200:1, at least about 250:1, or at least about 300:1) to at most about 1000:1 (e.g., or at most about 500:1). In one or more embodiments, the removal rate for molybdenum can be from at least about 500 Å/min (e.g., at least about 750 Å/min, at least about 1000 Å/min, at least about 1250 Å/min, at least about 1500 Å/min, at least about 1750 Å/min, or at least about 2000 Å/min) to at most about 10000 Å/min. In one or more embodiments, the removal rates and ratios described above can be applicable when measuring removal rates for polishing either blanket wafers or patterned wafers (e.g., wafers including conductive layers, barrier layers, and/or dielectric layers).

In one or more embodiments, this disclosure features a method of polishing that can include applying a polishing composition according to the present disclosure to a substrate (e.g., a wafer); and bringing a pad (e.g., a polishing pad) into contact with the surface of the substrate and moving the pad in relation to the substrate. In one or more embodiments, the substrate can include at least one of silicon oxides (e.g., tetraethyl orthosilicate (TEOS), high density plasma oxide (HDP), high aspect ratio process oxide (HARP), or borophosphosilicate glass (BPSG)), spin on films (e.g., films based on inorganic particle or films based on cross-linkable carbon polymer), silicon nitride, silicon carbide, high-K dielectrics (e.g., metal oxides of hafnium, aluminum, or zirconium), silicon (e.g., polysilicon, single crystalline silicon, or amorphous silicon), carbon, metals (e.g., tungsten, copper, cobalt, ruthenium, molybdenum, titanium, tantalum, or aluminum) or alloys thereof, metal nitrides (e.g., titanium nitride or tantalum nitride), and mixtures or combinations thereof. In one or more embodiments, the polishing method can include applying a polishing composition described herein to a substrate (e.g., a wafer) containing molybdenum and/or its alloys on a surface of the substrate.

In one or more embodiments, the method that uses a polishing composition described herein can further include producing a semiconductor device from the substrate treated by the polishing composition through one or more steps. For example, photolithography, ion implantation, dry/wet etching, plasma etching, deposition (e.g., PVD, CVD, ALD, ECD), wafer mounting, die cutting, packaging, and testing can be used to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present invention to its fullest extent.

EXAMPLES

In these examples, the polishing was performed on 300 mm wafers using an AMAT Reflexion LK CMP polisher with a VP6000 pad and a slurry flow rate of 300 mL/min.

The general compositions used in the examples are shown in Table 1 below. The specific details on the differences in the compositions tested will be explained in further detail when discussing the respective examples.

TABLE 1

| Component | % By Weight of the Composition |
|---|---|
| pH adjuster (base) | 0.005-1 |
| Organic Acid | 0.001-1 |
| First amine (alkylamine including a 6-24 carbon alkyl group) | 0.001-0.5 (if used) |
| Second amine (amine compound containing at least two nitrogen atoms) | 0.001-0.5 (if used) |
| Organic Solvent | 0.001-1 |
| Abrasive (silica) | 0.1-5 |
| Oxidizer | 0.1-5 |

TABLE 1-continued

| Component | % By Weight of the Composition |
|---|---|
| Solvent (DI Water) | 75-99 |
| pH | 3-7 |

Example 1

The Static Etch Rate (SER) for molybdenum was measured by suspending molybdenum coupons in Compositions 1-4 at 45° C. for one minute, and the molybdenum removal rate (RR) was measured by polishing blanket molybdenum wafers with Compositions 2-4. Compositions 1-4 were identical except that (1) Composition 1 was a control and did not include either amine compound listed in Table 1 above, and (2) Compositions 2-4 included the same alkylamine including a single amine group and a 6-24 carbon alkyl group in 1×, 1.5×, and 2× concentration, respectively. Compositions 1-4 did not include the second amine. The test results are summarized in Table 2 below.

TABLE 2

| | Comp. 1 | Comp. 2 | Comp. 3 | Comp. 4 |
|---|---|---|---|---|
| First Amine | None | 1X | 1.5X | 2X |
| Mo SER (Å/min) | 2000 | 28 | 18 | 15 |
| Mo RR (Å/min) | N/A | 306 | 247 | 227 |

The results show that the alkylamine compound (i.e., the first amine) effectively reduced the molybdenum static etch rate, with increasing amounts showing more reduction. Composition 1, without the alkylamine compound, was completely cleared of Mo during the SER test. These results suggest that the alkylamine compound can be used as a corrosion inhibitor for Mo during a CMP process.

Example 2

The Static Etch Rate (SER) for molybdenum was measured by suspending molybdenum coupons in Compositions 5-8 at 45° C. for one minute and the molybdenum and TEOS removal rates (RR) were measured by polishing blanket wafers with Compositions 5-8. Compositions 5-8 all included the same first amine (i.e., an alkylamine compound including a single amine group and a 6-24 carbon alkyl group) at the same concentration. Compositions 6-8 also included the same second amine (i.e., an amine compound containing at least two nitrogen atoms) in amounts of 1×, 2×, and 3×, respectively. The test results are summarized in Table 3 below.

TABLE 3

| | Comp. 5 | Comp. 6 | Comp. 7 | Comp. 8 |
|---|---|---|---|---|
| Second amine | None | 1X | 2X | 3X |
| Mo SER (Å/min) | 24 | 19 | 19 | 19 |
| Mo RR (Å/min) | 246 | 1011 | 972 | 1200 |
| TEOS RR | 32 | 34 | 64 | 84 |

The results show that the inclusion of the amine compound containing at least two nitrogen atoms (i.e., the second amine) greatly increased the polishing removal rate of molybdenum. However, the SER of Mo actually decreased upon the addition of the second amine compound.

This is a surprising result that suggests a unique synergism (e.g., having a relatively high Mo removal rate with a relatively low Mo corrosion) between the first and second amine compounds present in the compositions. Specifically, one would expect the SER of the composition to increase upon the addition of a compound that so dramatically increases the RR. The fact that compositions 6-8 show the opposite effect on SER suggests that the compositions deliver a more controlled polishing that does not rely significantly on molybdenum etching to remove molybdenum. This is important because high etching/corrosion typically leads to increases in the introduction of defects during polishing, which can reduce the ultimate yield of usable devices.

Example 3

The Static Etch Rate (SER) for molybdenum was measured by suspending molybdenum coupons in Compositions 9-11 at 45° C. for one minute and the molybdenum and TEOS removal rates (RR) were measured by polishing blanket wafers with Compositions 9-11. Compositions 9-11 included of the same amount of an alkylamine compound including a single amine group and a 6-24 carbon alkyl group (i.e., the first amine) and the same amount of an amine compound containing at least two nitrogen atoms (i.e., the second amine). Composition 9 included a silica whose surface was modified via sulfonic acid group addition to have a negative charge. Composition 10 included a silica whose surface was modified via amino group addition to have a positive charge. Composition 11 was a non-modified (i.e., native) silica with no surface modification. All of the silica samples used had comparable particle sizes. The test results are summarized in Table 3 below.

TABLE 4

|  | Comp. 9 | Comp. 10 | Comp. 11 |
|---|---|---|---|
| Silica | Negative charged | Positive charged | Non-Modified |
| Mo SER (Å/min) | 24 | 18 | 17 |
| Mo RR (Å/min) | 1006 | 568 | 456 |
| TEOS RR | 32 | 250 | 108 |
| Mo/TEOS RR Ratio | 31.4 | 2.3 | 4.2 |

The results show that Composition 9, with the negatively charged silica, has a significantly higher Mo/TEOS removal rate ratio when compared with Compositions 10 and 11.

While this disclosure has been described with respect to the examples set forth herein, it is understood that other modifications and variations are possible without departing from the spirit and scope of the disclosure as defined in the appended claims.

The invention claimed is:

1. A method, comprising:
    applying a polishing composition to a substrate comprising molybdenum or an alloy thereof on a surface of the substrate; and
    bringing a pad into contact with the surface of the substrate and moving the pad in relation to the substrate, wherein the polishing composition comprises:
    at least one abrasive;
    at least one organic acid or a salt thereof;
    at least one first amine compound, the at least one first amine compound comprising an alkylamine having a 6-24 carbon alkyl chain;
    at least one second amine compound containing at least two nitrogen atoms, the second amine compound being different from the first amine compound; and
    an aqueous solvent.

2. The method of claim 1, wherein the at least one abrasive is selected from the group consisting of alumina, silica, titania, ceria, zirconia, co-formed products of alumina, silica, titania, ceria, or zirconia, coated abrasives, surface modified abrasives, and mixtures thereof.

3. The method of claim 1, wherein the at least one abrasive is in an amount of from about 0.01% to about 50% by weight of the composition.

4. The method of claim 1, wherein the at least one organic acid is selected from the group consisting of a carboxylic acid, an amino acid, a sulfonic acid, a phosphonic acid, and mixtures thereof.

5. The method of claim 1, wherein the at least one organic acid or a salt thereof is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethanesulfonic acid, ethyl phosphoric acid, cyanoethyl phosphoric acid, phenyl phosphoric acid, vinyl phosphoric acid, poly (vinylphosphonic acid), 1-hydroxyethane-1,1-diphosphonic acid, nitrilotri(methylphosphonic acid), diethylenetriaminepentakis(methylphosphonic acid), N,N,N'N'-ethylenediaminetetrakis(methylene phosphonic acid), n-hexylphosphonic acid, benzylphosphonic acid, phenylphosphonic acid, salts thereof, and mixtures thereof.

6. The method of claim 1, wherein the at least one organic acid or a salt thereof is in an amount of from about 0.001% to about 10% by weight of the composition.

7. The method of claim 1, wherein the at least one first amine compound comprises an alkylamine having an alkyl chain that includes between 6 and 18 carbons.

8. The method of claim 1, wherein the at least one first amine compound is in an amount of from about 0.001% to about 5% by weight of the composition.

9. The method of claim 1, wherein the at least one second amine compound has a molecular weight between about 50 g/mol and about 1000 g/mol.

10. The method of claim 1, wherein the at least one second amine compound comprises a non-linear diamine.

11. The method of claim 1, wherein the at least one second amine compound is selected from the group consisting of 1,3 pentanediamine, aminopropyl di-iso-propanolamine, aminopropyldiethanolamine, ethylenediamine, 1,3-diaminopropane, butane-1,4-diamine, pentane-1,5-diamine, aminoethylethanolamine, trimethylethylenediamine, 1,2-diaminopropane, and mixtures thereof.

12. The method of claim 1, wherein the at least one second amine compound is in an amount from about 0.001% to about 5% by weight of the composition.

13. The method of claim 1, further comprising:
    an organic solvent in an amount of from about 0.001% to about 10% by weight of the composition.

14. The method of claim 13, wherein the organic solvent is selected from the group consisting of ethanol, 1-propanol, 2-propanol, n-butanol, propylene glycol, 2-methoxyethanol, 2-ethoxyethanol, propylene glycol propyl ether, ethylene glycol, and any combinations thereof.

15. The method of claim 1, wherein the composition has a pH ranging from about 2 to about 11.

16. The method of claim 1, further comprising forming a semiconductor device from the substrate.

17. A method, comprising:
   applying a polishing composition to a substrate comprising molybdenum or an alloy thereof on a surface of the substrate; and
   bringing a pad into contact with the surface of the substrate and moving the pad in relation to the substrate, wherein the polishing composition comprises:
   at least one abrasive;
   at least one organic acid or a salt thereof;
   at least one first amine compound, the at least one first amine compound comprising an alkylamine having a 6-24 carbon alkyl chain; and
   an aqueous solvent.

18. The method of claim 17, further comprising forming a semiconductor device from the substrate.

19. The method of claim 17, wherein the polishing composition further comprises at least one second amine compound containing at least two nitrogen atoms, the second amine compound being different from the first amine compound.

20. The method of claim 19, wherein the at least one second amine compound comprises a non-linear diamine.

\* \* \* \* \*